United States Patent
Tsai et al.

(10) Patent No.: US 8,900,344 B2
(45) Date of Patent: Dec. 2, 2014

(54) HYDROGEN SELECTIVE PROTECTIVE COATING, COATED ARTICLE AND METHOD

(75) Inventors: Chung Yi A. Tsai, Blaine, MN (US); Siu-Yue Tam, Blaine, MN (US)

(73) Assignee: T3 Scientific LLC, Blaine, MN (US)

( * ) Notice: Subject to any disclaimer, the term of this patent is extended or adjusted under 35 U.S.C. 154(b) by 151 days.

(21) Appl. No.: 13/581,587

(22) PCT Filed: Mar. 21, 2011

(86) PCT No.: PCT/US2011/029156
§ 371 (c)(1),
(2), (4) Date: Aug. 28, 2012

(87) PCT Pub. No.: WO2011/119469
PCT Pub. Date: Sep. 29, 2011

(65) Prior Publication Data
US 2012/0325087 A1    Dec. 27, 2012

Related U.S. Application Data

(60) Provisional application No. 61/340,703, filed on Mar. 22, 2010.

(51) Int. Cl.
*B01D 53/22* (2006.01)
*B01D 71/02* (2006.01)
*C23C 16/40* (2006.01)
*C01B 3/50* (2006.01)
*C23C 16/455* (2006.01)
*B01D 67/00* (2006.01)

(52) U.S. Cl.
CPC ............ *C23C 16/402* (2013.01); *B01D 71/022* (2013.01); *B01D 2239/0478* (2013.01); *C01B 3/505* (2013.01); *C23C 16/45542* (2013.01); *B01D 67/0088* (2013.01); *C23C 16/45555* (2013.01); *C01B 3/503* (2013.01)
USPC ............... 95/55; 95/56; 96/11; 427/248.1

(58) Field of Classification Search
USPC .......... 96/11; 95/55, 56; 427/245, 248.1, 250; 428/457
See application file for complete search history.

(56) References Cited

U.S. PATENT DOCUMENTS 3,019,853 A * 2/1962 McAfee, Jr. et al. ............. 95/53
3,344,582 A * 10/1967 Merrill et al. .................... 95/56
(Continued)

FOREIGN PATENT DOCUMENTS

EP    0107636 B1    12/1986
EP    0682560 B1    4/1998
(Continued)

OTHER PUBLICATIONS

International Search Report and Written Opinion for PCT/US11/29156, Jun. 13, 2011, 17 pages.
(Continued)

*Primary Examiner* — Jason M Greene
(74) *Attorney, Agent, or Firm* — Fredrikson & Byron, P.A.

(57) ABSTRACT

Hydrogen selective coatings, coated articles and methods for their formation and for hydrogen separation or purification. The coatings are formed by atomic layer deposition of suitable metal oxides with desirable hydrogen activation energy or hydrogen flux, e.g., silicon dioxide, and can be borne on a nonporous, thin-film metal or cermet substrate, e.g., a palladium sheet or layer. The coated substrate may include a porous support for the sheet or layer. The coated article may be used as a purification membrane and the coating can protect the metal layer from contaminants in the gas or process stream from which hydrogen is being purified. In some embodiments, the coated article can provide such protection at elevated temperatures in excess of 300° C.; and in other embodiments, can provide protection at temperatures in excess of 600° C. and even in excess of 800° C.

16 Claims, 5 Drawing Sheets

(56) References Cited

U.S. PATENT DOCUMENTS

| | | | |
|---|---|---|---|
| 4,171,193 | A | 10/1979 | Rahlfs |
| 4,222,025 | A | 9/1980 | Iles et al. |
| 4,347,732 | A | 9/1982 | Leary |
| 4,378,691 | A | 4/1983 | Terada et al. |
| 4,407,891 | A | 10/1983 | Ernsberger |
| 4,423,407 | A | 12/1983 | Zuckerman |
| 4,555,536 | A | 11/1985 | Maki et al. |
| 4,784,769 | A | 11/1988 | Giordano, Jr. et al. |
| 4,892,564 | A | 1/1990 | Cooley |
| 5,259,870 | A | 11/1993 | Edlund |
| 5,401,307 | A | 3/1995 | Czech et al. |
| 5,482,746 | A | 1/1996 | Liberti et al. |
| 5,614,001 | A | 3/1997 | Kosaka et al. |
| 5,783,154 | A | 7/1998 | Althainz et al. |
| 5,827,569 | A | 10/1998 | Akiyama et al. |
| 6,012,327 | A | 1/2000 | Seth et al. |
| 6,066,592 | A | 5/2000 | Kawae et al. |
| 6,152,987 | A | 11/2000 | Ma et al. |
| 6,165,336 | A | 12/2000 | Maki et al. |
| 6,214,090 | B1 | 4/2001 | Dye et al. |
| 6,513,364 | B1 | 2/2003 | Jonda et al. |
| 6,527,833 | B1* | 3/2003 | Oyama et al. ............... 96/10 |
| 6,541,676 | B1 | 4/2003 | Franz et al. |
| 6,634,213 | B1 | 10/2003 | O'Connor et al. |
| 6,641,647 | B2 | 11/2003 | Uemura et al. |
| 6,974,636 | B2 | 12/2005 | Darolia et al. |
| 7,163,721 | B2 | 1/2007 | Zhang et al. |
| 7,179,325 | B2 | 2/2007 | Oyama et al. |
| 7,211,706 | B2 | 5/2007 | Gauthier et al. |
| 7,622,400 | B1 | 11/2009 | Fox et al. |
| 7,862,648 | B2 | 1/2011 | Oyama et al. |
| 2001/0020416 | A1 | 9/2001 | Yoshikawa et al. |
| 2002/0142172 | A1 | 10/2002 | Brinker et al. |
| 2005/0181535 | A1 | 8/2005 | Yun et al. |
| 2007/0054048 | A1 | 3/2007 | Haukka et al. |
| 2007/0194452 | A1* | 8/2007 | Aoyama et al. ............... 257/761 |
| 2007/0224414 | A1 | 9/2007 | Leonard et al. |
| 2007/0256562 | A1* | 11/2007 | Routkevitch et al. ............ 96/11 |
| 2007/0278444 | A1 | 12/2007 | Brondum et al. |
| 2008/0000350 | A1* | 1/2008 | Mundschau et al. ............... 95/56 |
| 2008/0006574 | A1 | 1/2008 | Ramaswamy et al. |
| 2008/0174040 | A1 | 7/2008 | Saukaitis et al. |
| 2008/0254231 | A1 | 10/2008 | Lin et al. |
| 2009/0011315 | A1 | 1/2009 | Gauckler et al. |
| 2009/0041952 | A1 | 2/2009 | Yoon et al. |
| 2009/0107330 | A1* | 4/2009 | Gu ...................... 95/55 |
| 2009/0277331 | A1 | 11/2009 | Li et al. |
| 2009/0282983 | A1* | 11/2009 | Oyama et al. .................. 96/11 |
| 2009/0283139 | A1 | 11/2009 | Chen et al. |
| 2009/0301879 | A1 | 12/2009 | Soundarrajan et al. |
| 2009/0311444 | A1 | 12/2009 | Scherer et al. |
| 2010/0077529 | A1 | 4/2010 | Stone et al. |
| 2010/0304047 | A1 | 12/2010 | Yang et al. |

FOREIGN PATENT DOCUMENTS

| | | |
|---|---|---|
| EP | 0768986 B1 | 9/2003 |
| EP | 1 982 955 A2 | 10/2008 |
| JP | 2006 289345 A | 10/2006 |
| JP | 2008 289948 A | 12/2008 |
| JP | 2009 006260 A | 1/2009 |
| JP | 2009 286637 A | 12/2009 |

OTHER PUBLICATIONS

Dingemans et al., "Comparison Between Aluminum Oxide Surface Passivation Films Deposited with Thermal ALD, Plasma ALD and PECVD," 35th IEEE PVSC Jun. 20-25, 2010, Honolulu, Hawaii, 4 pages.

Lee, R.W., "Diffusion of Hydrogen in Natural and Synthetic Fused Quartz," The Journal of Chemical Physics, vol. 38, No. 2, Jan. 15, 1963, 8 pages.

Gopalakrishnan, et al., "A Hybrid Processing Method for High Performance Hydrogen-Selective Silica Membranes," Journal of Membrane Science 297 (2007), 5 pages.

Oyama, et al., "Theory of Hydrogen Permeability in Nonporous Silica Membranes," Journal of Membrane Science 244 (2004), 9 pages.

Supplementary European Search Report of corresponding application No. 11759971.2, mailed Jan. 22, 2014, 11 pgs.

Kurita N. et al., "Measurement of Hydrogen Permeation Through Fused Silica and Borosilicate Glass by Eelctrochemical Pumpusing Using Oxide Protonic Conductor", Solid State Ionics, North Holland Pub. Company, Amsterdam, NL, vol. 146, No. 1-2, Jan. 1, 2002, pp. 101-111.

* cited by examiner

HYDROGEN SELECTIVE PROTECTIVE COATING, COATED ARTICLE AND METHOD

RELATED APPLICATIONS

This application is a 35 U.S.C. 371 national stage filing from International Application No. PCT/US2011/029156 filed Mar. 21, 2011, which in turn claims priority to US Provisional Application No. 61/340,703 filed Mar. 22, 2010, the teachings of which are incorporated herein by reference.

STATEMENT REGARDING FEDERALLY SPONSORED RESEARCH

This invention was made, at least in part, with government support under National Science Foundation Grant No. 944769. The government may have certain rights in this invention.

FIELD OF INVENTION

This invention relates to protective coatings and, more particularly, to hydrogen selective protective coatings, to coated articles bearing such coatings and to related methods.

BACKGROUND OF THE INVENTION

Hydrogen is a key building block of many chemical processes. Virtually all hydrogen produced to date is used for chemical processes. Hydrogen can be produced in several ways, but economically the most important processes involve producing hydrogen from hydrocarbons. Fossil fuels including coal, oil and natural gas currently are the main sources of hydrocarbons for hydrogen production and biomass is an emerging source used, for example, in the production of biofuels. Gas streams containing hydrogen production as product or by-product of the processing of all of these hydrocarbon sources often contain corrosive gases such as hydrogen sulfide ($H_2S$) and halides that attack metals on contact.

Of all the trace corrosive gases in the gas stream, $H_2S$ is one of the most problematic for metal and metal alloys. Various methods have been developed to protect metal components of gas purification devices or membranes from these corrosive gases, such as alloying or incorporation of polymeric coatings. Efforts in alloying for sulfur resistance have only resulted in marginal improvement due to the basic fact that metals are prone to be attacked by highly corrosive gases, especially in high temperature environments (e.g., temperatures above 300° C.) typically found in process gas streams from which hydrogen is to be recovered. None of these methods selectively allow hydrogen to pass through and at the same time protect metal membranes from corrosive gases, such as $H_2S$, in elevated temperature environments.

In hydrogen purification systems employing metal membranes or metal sheet-like layers, hydrogen molecules travel to and contact a first surface of a metal membrane, e.g., palladium (Pd) membrane, and are split into hydrogen atoms by the catalytic reaction or effect at catalytically active sites on the palladium membrane. The hydrogen atoms then transport through the palladium membrane or metal layer and recombine at the second or opposite surface of the membrane as hydrogen molecules. Corrosive gases, such as the sulfur based gases, can react with the catalytically active sites of the metal membrane reducing the number of available sites and the separation performance of the membrane. In order to minimize or avoid such reactions with corrosive gases, they must be removed prior to process gases being separated through the membrane. Scrubbing or polishing steps used for such removal can add extra costs to commercial operations and can still leave enough residual amounts as to be problematic. For example, as reported in U.S. Pat. No. 3,350,845 to McKinley, even with a reduction in sulfur content to as low as 4 ppm, such small amounts are still sufficient to reduce hydrogen permeance across a palladium foil by 70% at 350° C. Reduction of catalytically active sites can also be problematic in hydrogen sensor applications that use palladium or other similarly affected metals or metal alloys in the sensing element.

In view of the foregoing, it would be desirable to provide a coating that protects contaminant-sensitive, metal-containing membranes or sensors, such as those formed of palladium or palladium alloy. It would also be desirable to provide a coating that separates out contaminant gases and allows high hydrogen permeation rates or flux, particularly in a high temperature corrosive environment.

SUMMARY OF THE INVENTION

Embodiments of the invention include hydrogen selective protective coating, hydrogen selective coated articles, methods of making hydrogen selective coated articles and methods of using hydrogen selective coated articles for hydrogen separation or purification.

In an embodiment of the invention a hydrogen selective coated article is provided. The coated article of this embodiment is comprises a hydrogen permeable substrate comprised of a nonporous metal layer and an atomic layer deposition deposited hydrogen selective coating having a thickness from about 0.5 nm to about 100 nm. In some further embodiments, the substrate can further comprise a porous support.

In some embodiments, the hydrogen selective coating is a metal oxide layer comprised of a silicon metal oxide. In other embodiments, the hydrogen selective coating can be a metal oxide selected from the group consisting of oxides of silicon and titanium. In yet other embodiments, the hydrogen selective coating is a metal oxide, a metal nitride layer, an oxynitride layer or a layer comprised of a combination thereof. In some further embodiments, the hydrogen selective coating is a material selected from the group consisting of metal oxides, metal nitrides and metal oxynitrides or nitrides of silicon, titanium, germanium, boron, and combinations thereof.

In some embodiments of coated articles according to the invention, the hydrogen selective coating has a hydrogen permeation activation energy of at least 37.0 kJ/mol.5. In some other embodiments, the hydrogen selective coating is a metal oxide layer comprised of high density silica having a hydrogen permeation activation energy of at least 39.0 kJ/mol.

In some embodiments of the invention, the coated article has high hydrogen permeability at temperatures from about 300° C. to about 600° C. In some other embodiments, the coated article has hydrogen permeability of at least 129 scf/ft$^2$-h-100 psia at temperatures of about 600° C.

In some embodiments, the hydrogen selective has a thickness ranging from about 0.5 nm to about 100 nm, e.g., from about 0.5 nm to about 90 nm, or from about 0.5 nm to about 60 nm, or from about 0.5 nm to about 50 nm, or from about 0.5 nm to about 40 nm, or from about 0.5 nm to about 30 nm, or from about 0.5 nm to about 20 nm, or from about 0.5 nm to about 10 nm or other thickness ranges within the range of from about 0.5 nm to about 100 nm, e.g., from about 10 nm to about 70 nm, or from about 30 nm to about 60 nm.

In one embodiment of a coated article according to the invention, the hydrogen permeable substrate is a metal layer comprises of palladium metal, and the hydrogen selective coating is comprised of silica having a thickness ranging from about 0.5 nm to about 50 nm and a hydrogen permeation activation energy of at least 37.0 kJ/mol.

In another embodiment of the invention, a method of forming a hydrogen selective coated article is provided. The method of this embodiment comprises the steps of: a) providing an atomic layer deposition system having a deposition chamber; b) providing a hydrogen permeable nonporous substrate in the chamber, the substrate comprising a metal layer; and c) depositing a hydrogen selective metal oxide or nitride layer on the substrate from with the atomic layer deposition system.

In a further embodiment of the invention, the use of a hydrogen permeable nonporous metal layer coated with an ALD deposited silica layer as a hydrogen purification membrane is provided.

In yet another embodiment of the invention, a method of separating hydrogen gas from a gas stream is provided. In the embodiment, the method comprises the steps of: providing a hydrogen purification membrane comprised of a hydrogen permeable nonporous metal layer coated with an ALD deposited silica layer; contacting a first side of the membrane with a hydrogen containing gas stream; and separating hydrogen gas from the gas stream. The method of this embodiment can further comprise the step of collecting hydrogen gas that has been separated from the gas stream.

BRIEF DESCRIPTION OF THE DRAWINGS

FIG. 9 is an illustrative process flow diagram showing a typical hydrodesulfurization process in oil refineries. The black box represents a separation module including one or more hydrogen selective coated articles (10) according to an embodiment of the invention in a suggested location for hydrogen purification. The circled process can be eliminated when an embodiment of this invention is used.

DRAWINGS—REFERENCE NUMERALS

10 Hydrogen selective coated article
11 Hydrogen permeable substrate
12 Hydrogen selective coating or metal oxide layer or protective layer
13 Metal layer or hydrogen permeable layer
14 Porous support
15 Process gas or gas mixture
16 Pure/separated hydrogen
20 Atomic layer deposition (ALD) system
21 Vacuum port
22 Deposition chamber
23 Substrate holder or mount
24 Plasma wrap
25 Gas inlet

DETAILED DESCRIPTION OF THE INVENTION

The following detailed description is to be read with reference to the drawings, in which like elements in different drawings have like reference numbers. The drawings, which are not necessarily to scale, depict selected embodiments and are not intended to limit the scope of the invention. Skilled artisans will recognize that the given examples have many alternatives that fall within the scope of the invention.

Figure 1:
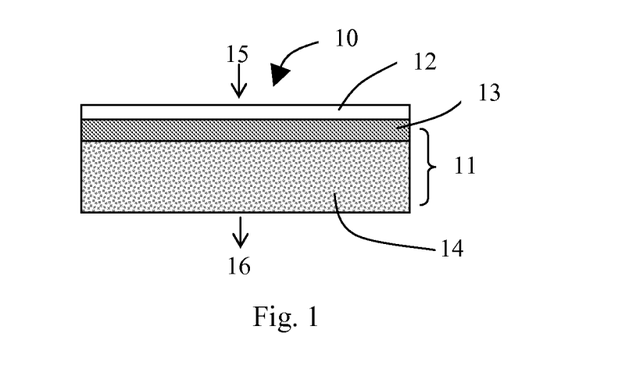
FIG. 1 is a schematic diagram of a coated article (10) according to an embodiment of the invention and shows a hydrogen selective metal oxide layer (12) deposited on a metal layer (13) of a substrate (11) including a support (14). Gas mixture (15) contacts layer (12) with pure hydrogen (16) passing through coated article (10).

Referring to FIG. 1, a coated article according to an embodiment of the invention is shown. In FIG. 1, hydrogen selective coated article 10 includes a hydrogen permeable substrate 11 and a coating 12. (Coating 12 may also be referred to herein as hydrogen selective metal oxide layer 12 or hydrogen selective protective layer 12.) Substrate 11 as shown comprises a metal layer 13 and a porous support 14. (Metal layer 13 may also be referred to herein as hydrogen permeable layer 13.) In some other embodiments of the invention, substrate 11 will not include a support 14 in which case coated article 10 would comprise a metal layer 13 and a coating 12.

In an embodiment of the invention, hydrogen permeable layer 13 is a dense or non-porous material that is hydrogen permeable. Suitable materials for hydrogen permeable layer 13 include but are not limited to metals, metal alloys, or a cermet (a composite material or matrix formed of metal or metal alloy and a ceramic material). Hydrogen permeable layer 13 may also be referred to herein as "metal layer 13." When used as a general reference, "metal layer 13" should be understood to also refer to hydrogen permeable layers formed of metal, metal alloy, or cermet material. When layer 13 is formed of a metal or metal alloy, layer 13 may be formed of materials including, but not limited to, cerium, yttrium, niobium, tantalum, vanadium, zirconium, palladium, platinum, nickel, copper, silver, gold, titanium, ruthenium and alloys or combinations of one or more of these metals.

In some embodiments of the invention, layer 13 is a membrane or foil-like sheet formed of or including palladium metal or a palladium alloy such as palladium gold, and palladium gold ruthenium. Uncoated dense palladium or palladium alloy membranes or membrane modules can be obtained commercially from companies such as REB Research of Oak Park, Mich., Johnson Matthey of London, UK, Hy9 Hopkinton, Mass., and Green Hydrotec, Inc. of Royston, Hertfordshire, UK.

The need for a thin film protective coating on a metal, metal alloy or cermet substrate that protects the substrate against highly corrosive gases or impurities, such as $H_2S$ and halides, in high temperature operation (>300° C.) while selectively allowing hydrogen to pass through has been identified. According to embodiments of the invention, a coating 12, also referred to as a hydrogen selective protective layer 12 or a hydrogen selective metal oxide layer 12, is provided to protect the substrate and selectively allowing only hydrogen to pass through and contact hydrogen permeable layer 13 of substrate 11. In some embodiments, the coated article can provide such protection at elevated temperatures in excess of 300° C.; and in other embodiments, can provide protection at temperatures in excess of 600° C. and even in excess of 800° C.

Materials suitable for use in coating 12 are materials that are selectively hydrogen permeable that can be provided in the form of thin films of thicknesses having minimal impact on hydrogen flux or permeability. Particularly suitable materials will be resistant to corrosive gases that may be present in process gas streams. Non-limiting examples of suitable materials are metal oxides, metal nitrides, and metal oxynitrides, including but not limited to oxides, nitrides and oxynitrides of silicon, titanium, germanium, boron, and combinations thereof.

While techniques such as sputtering or chemical vapor deposition (CVD) have been used in the prior art to provide protective coatings on metal films and substrates, they do not produce layers having densities comparable to the densities that can be obtained with ALD deposition techniques. With increased density, thinner layers of hydrogen selective materials can be provided. Denser layers or extremely dense layers allow significant reduction in layer thickness to provide desirable hydrogen flux for hydrogen purification and yet provide secured protection against transport of highly corrosive gases in extremely hostile environment. Denser layers or extremely dense layers also can eliminate water vapor condensation in pores or interstices of metal oxide layers that can inhibit or interfere with hydrogen flux or permeance across coating 12.

In some embodiments of the invention, a desirable property of materials used to form coating 12 is an activation energy for hydrogen permeation at least comparable to that of vitreous silica glass (37.2-38.8 kJ/mol), or of at least about 37 kJ/mol. Silica formed by ALD deposition, is one such material. It is inert to corrosive gases in process streams from which hydrogen is to be separated and is extremely dense. This extremely dense silica has an activation energy for hydrogen permeation higher than 39.0 kJ/mol. Activation energy is the energy that must be overcome in order for gas permeation to occur. The higher the activation energy, the more stable the material. Protective coating made with ALD deposited silica have excellent chemical stability against CO, $CO_2$, water vapor, halides and other impurities in common syngas ($H_2$+CO) stream or other process gas streams. In particular, protective coatings made with this material have high tolerance to sulfur and chlorine compounds due to the inherent high acid resistance nature of silica.

Also, ALD deposited silica can be deposited with sufficient density to provide for the formation of a thin hydrogen selective metal oxide layer 12. ALD deposited silica can be deposited as thin or ultra thin films through which hydrogen can permeate at high flux while blocking other gases. This characteristic is especially valuable for applications that require hydrogen permeation. Hydrogen permeance of silica is inversely proportional to its thickness and increases with temperature. High hydrogen flux can be achieved by thin protective coatings (<100 nm) or ultra thin protective coatings (<20 nm or <10 nm) at elevated temperatures (>300° C.). Note, this level of elevated temperature is typical in hydrogen containing gas streams from fossil fuel and biomass sources. High activation energy also associates with high density. This highly dense class of material makes it possible to deposit ultra thin protective layer for high hydrogen flux. Lower density materials have inherent microporosity or local defect which makes it unsuitable to be used as a protective coating.

The more detrimental aspect of microporosity in the protective layer, even unintended, is its resistance to hydrogen permeation. If the microporous pore size is larger than the size of $H_2S$, then of course the protection function is highly crippled. Even if the pore size is smaller than the size of $H_2S$ and it successfully blocks $H_2S$ from going through, other gases with smaller molecular size in the processing stream can still diffuse into the protective layer. Since hydrogen is the only gas that can diffuse through the underlying dense hydrogen permeable layer 13, these trapped gases cause a diffusion barrier for hydrogen diffusion. This aspect is especially critical to membrane application where hydrogen needs to pass through the protection layer in large flux. Extremely dense and pore free protective coating is essential to the success of this material as a protective layer for membrane application.

In some embodiments of the invention, ALD deposited silica can have a thickness ranging from about 0.5 nm to about 100 nm, such as from about 0.5 to about 80 nm, or from about 0.5 to about 60 nm, or from about 0.5 to about 50 nm, from about 0.5 to about 40 nm, or from about 0.5 to about 40 nm, or from about 0.5 nm to about 30 nm, or from about 0.5 to about 20 nm, or from about 0.5 to about 10 nm or other thickness ranges within the range from about 0.5 nm to about 100 nm.

Atomic layer deposition (ALD), including both thermal and plasma assisted processes, is suitable to deposit dense thin film and dense ultra thin film coatings 12. ALD is a self-limiting layer-by-layer thin film deposition technique composed of successive steps of adsorption and hydrolysis/activation of metal halide or metal alkoxide precursors. This step-by-step deposition process allows complete removal of reactants and by-products before the deposition of the next layer, minimizing the risk of trapping of unwanted molecules. Film or layer thicknesses can be controlled fairly precisely with ALD deposition.

In some embodiments of the invention, substrate 11 can include hydrogen permeable layer 13 and a porous support 14. Such a support may be needed when hydrogen permeable layer 13 is thin, particularly thin enough to be fragile or susceptible to mechanic or structural damage when handled in the absence of a support. Materials suitable for use for support 14 are themselves hydrogen permeable or can be formed into porous, permeable supports. It is also desirable that support materials be non-reactive to hydrogen. Non-limiting examples of suitable support materials include metals, metal alloys (e.g., stainless steel), ceramics (e.g., alumina), and cermet materials. Support 14 can be of any shape or dimension suitable to support hydrogen permeable layer 13, including but not limited to disk-shaped, flat sheet, tubular form and the like.

A coated article 10 according to the invention can be provided as part of a hydrogen purification system or separation module. In such a system, coated article 10 can have a hydrogen permeable substrate 13 in the form of a palladium membrane. When a process gas stream containing hydrogen atoms and corrosive constituents comes into pressurized contact with coated article 10, only hydrogen molecules pass through hydrogen selective layer 12 and contact a first surface of the palladium membrane. There the hydrogen atoms are split by the catalytic reaction or effect at catalytically active sites on the palladium membrane. The hydrogen atoms then transport through the palladium membrane and recombine at the second or opposite surface of the membrane as hydrogen molecules. The purified or separated hydrogen gas can then be collected, transported, containerized or subjected to other processing and handling.

Figure 2:
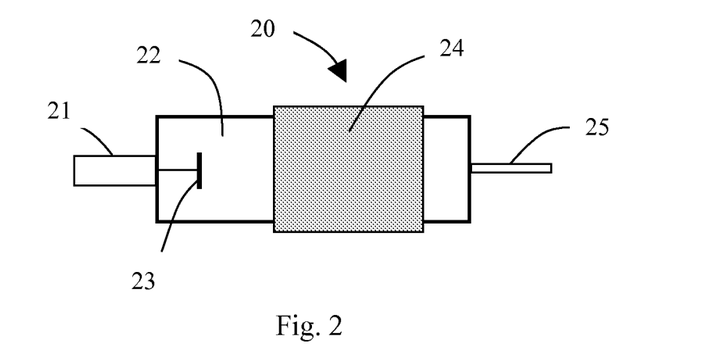
FIG. 2 is a schematic diagram of an ALD system (20) including a deposition chamber (22), a substrate holder (23), a vacuum port (21), a gas inlet (25) and an optional plasma wrap (24) that can be turned on when plasma assistance is needed.

Hydrogen selective coating 12 is an ALD deposited material and can be deposited by either thermal or plasma ALD processes. The method of the invention can be understood with reference to the following description of a method according to an embodiment of the invention. In this embodiment, hydrogen selective coating 12 is an ALD deposited silica film. Silica deposition is carried out in a plasma assisted atomic layer deposition (PA-ALD). A palladium membrane or sample is placed in chamber 22 of an ALD deposition system 20 and the silica layer is deposited on a surface of the membrane. Oxygen and HMDS (hexamethyldisilazane) or TEOS (tetraethyl orthosilicate) are used as the precursors for $SiO_2$. In the absence of plasma, these organosilanes remain unreactive to oxygen at low temperatures (e.g. <120° C.). These precursors are admitted into the deposition chamber 22 through a gas inlet 25 intermittently via pneumatic timing valves. A constant argon (Ar) flow of 15 standard cubic centimeters per minute (sccm) was used as the carrier gas as well as the purging gas, and the deposition proceeds via the following steps at a temperature of from about 90° C. to about 190° C.: 1) the sample is exposed to HMDS or TEOS; 2) the chamber is purged with argon; 3) the sample is exposed to an $Ar+O_2$ plasma; 4) the sample is then exposed to $H_2O$ vapor to enhance surface hydroxylation; and 5) the chamber is purged with argon. This cycle is repeated for a number of times until the desired thickness is achieved. While 15 sccm was utilized for the preparation of examples, it will be understood by those skilled in the art that different flow rates can be utilized. In an embodiment of the invention employing a thermal ALD process, thermal ALD is carried out in a tubular ALD chamber from about 200° C. to about 300° C. TMOS (tetra methyl ortho silicate) and water vapor are used as the precursors for $SiO_2$ deposition. A constant flow of argon is used as the carrier gas and the purging gas. The deposition proceeds by repeating the following steps 1) introducing TMOS vapor into the chamber; 2) purging the chamber with Ar; 3) introducing $H_2O$ vapor into the chamber; 4) purging the chamber. This cycle is repeated for a number of times until the desired thickness is achieved. It will be understood by those skilled in the art, that deposition can be carried out with other precursor materials and different operating conditions, including different temperatures. Commercially available ALD systems are available from a number of manufactures, including but not limited to Oxford Instruments of Oxfordshire, UK and Beneq Oy, Vantaa, Finland.

Examples of coated articles according to embodiments of the invention were prepared and tested with the results of the testing being presented in FIGS. 3-8 as discussed below.

Palladium foils purchased from Sigma-Aldrich or Alfa Aesar were sized and then coated using plasma assisted ALD methods described above. The samples were 1 inch diameter disks and were 25 µm thick. Coated foils were supported by 1/16 inch (0.1588 cm) thick 316 stainless steel porous supports with 2 µm pore size that were obtained from Applied Porous Technologies. The supports were calcined in air at 700° C. for twelve hours before attachment to the palladium foil. Once the membranes were properly sealed and leak-checked in the test module, pure hydrogen gas or a hydrogen containing mixed gas or gas mixture was introduced in contact with the coated palladium. The flow rate of permeated hydrogen through the membrane and the porous support was measured by bubble flow meter at the permeate side. The composition of the gases can be determined by gas chromatography. $H_2S$ was introduced in the mixed gas stream to test the coating's resistance to $H_2S$. Hydrogen flux is defined by hydrogen permeation flow rate divided by membrane area. Hydrogen permeance is hydrogen flux divided by hydrogen pressure differential across the membrane.

Figure 3:
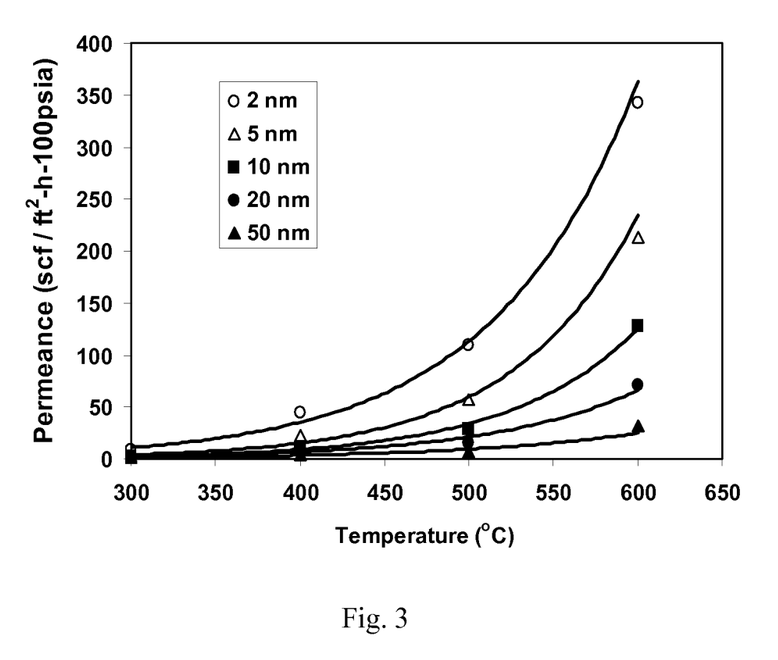
FIG. 3 is a graph plotting the performance of coated articles according to embodiments of the invention provided with dense silica layers (12) of different thicknesses (2 nm, 5 nm, 10 nm, 20 nm, and 50 nm) at temperatures ranging from about 300° C. to about 600° C.

FIG. 3 shows $H_2$ permeance of silica layers coated onto porous substrates with plasma assisted ALD and measured at elevated temperatures (300° C.-600° C.). The coating thicknesses were 2 nm, 5 nm, 10 nm, 20 nm and 50 nm. All the samples are highly stable under thermal cycles (300° C.-600° C.). $H_2$ gas molecules transport through membrane by activated diffusion. For the temperature-activated transport, permeance is proportional to $\exp(-E_a/RT)$, where $E_a$ is activation energy, R is Avogadro constant and T is temperature. In FIG. 3, activation energy for hydrogen permeation calculated for various thicknesses of silica described in the embodiments of this invention varied between 39.5-53.9 kJ/mol. The high activation energy is similar to or higher than that of vitreous silica glass (37.2-38.8 kJ/mol) as in reported R. W. Lee, J. Chem. Phys. 38 (1963) 488. The values are significantly higher than that of chemical vapor deposition (CVD)-deposited silica as reported. CVD-deposited silica using tetramethoxysilane (TMOS) or tetraethyl orthosilicate (TEOS) as precursors showed activation energy only around 15.56-16.4 kJ/mol as reported in Oyama et al., J. Memb. Sci, 244 (2004) 45-53 and in Gopalakrishnan et al., J. Memb. Sci. 297 (2007) 5-9. According to previous studies comparing porous sol-gel silica to dense silica layers, the higher the activation energy, the denser is the silica layer. The high activation energy of silica described in the embodiments of this invention indicates a much denser structure compared to that of the reported CVD-deposited silica. Although using the same TEOS as silica precursors, the atomic layer deposition (ALD) process allows complete removal of carbon species between deposition of layers while the reported CVD-deposited methods utilizing thermal decomposition of TEOS at 600° C. result in carbon residue in the deposited layer resulting in lower density. These residues become defect sites that facilitate the penetration of corrosive gases, e.g. $H_2S$, thus compromise the layer's long-term chemical and mechanical stability. Other work also pointed out that CVD deposition resulted in lower densities. A denser layer has a higher selectivity of hydrogen then a less dense layer because the layer is inherently structured to better block all other gases while allowing hydrogen to pass through.

Figure 4:
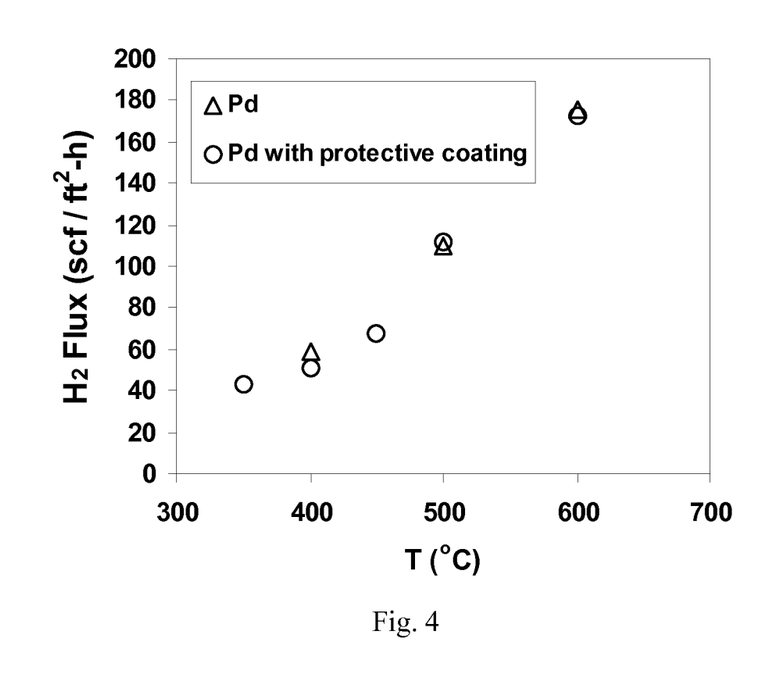
FIG. 4 is a graph plotting $H_2$ flux for a 25 μm thick palladium layer at various temperatures, with (circle) and without (triangle) a protective coating (12) according to an embodiment of the invention.

FIG. 4 is a graph plotting $H_2$ flux of Pd membranes (25 µm thick) with and without a 2 nm thick hydrogen selective coating deposited by plasma ALD according to an embodiment of the invention at temperatures from 350° C. to 600° C. The data shows that $H_2$ fluxes are essentially the same with and without protective coating at these temperatures. This demonstrates that the protective coating does not add flow resistance. This is can be important to applications that require high hydrogen flux or fast response time.

Figure 5:
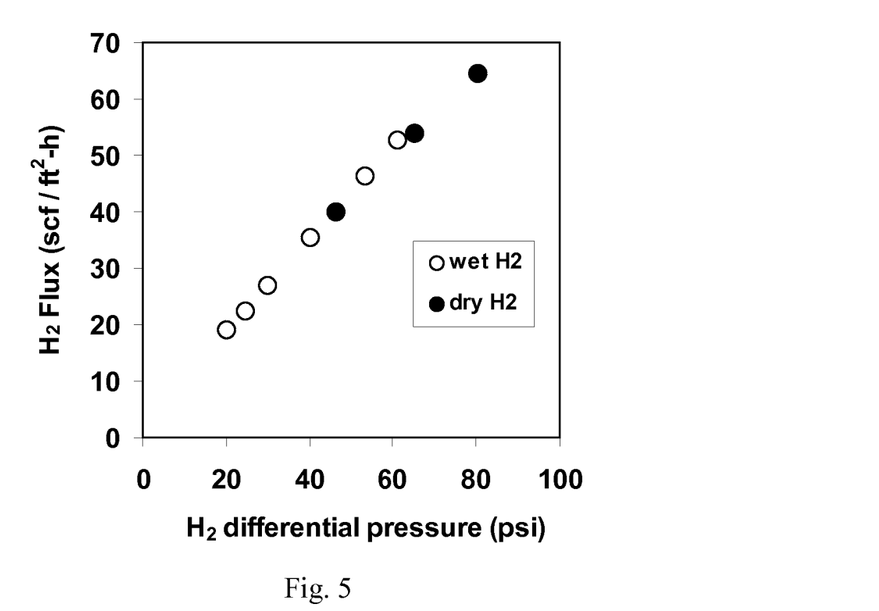
FIG. 5 is graph plotting $H_2$ flux at various pressures for a 2 nm protective coating (12) according to an embodiment of the invention on a 25 μm Pd membrane to illustrate the insignificant effect of water vapor (100% relative humidity) on $H_2$ flux at 400° C., with white circle representing wet conditions and black circle representing dry conditions.

Hydrogen flux across porous or lower density protective coatings can be reduced or inhibited in the presence of water vapor due to the blocking of pores or interstices from water vapor condensation on pore walls. Hydrogen selective coating 12 according to embodiments of the invention is of sufficient density that water vapor does not inhibit hydrogen flux. To demonstrate the performance of hydrogen selective coating 12, sample coated articles 10 having a 2 nm protective coating deposited by plasma ALD on 25 μm thick Pd membranes were prepared. "Wet" hydrogen gas was produced by feeding dry hydrogen into water bubbler prior to being brought into contact with the samples. FIG. 5 is a graph plotting $H_2$ flux at 400° C. of samples exposed to dry hydrogen (hydrogen gas without water vapor) and wet hydrogen (hydrogen gas containing water vapor at 100% relative humidity) as a function of $H_2$ differential pressure. The plotted data shows that there is not a significant difference in performance of coated articles according to embodiments of the invention in the presence of water vapor. This also further confirms that coating 12 is in fact, dense, non-porous.

Figure 6:
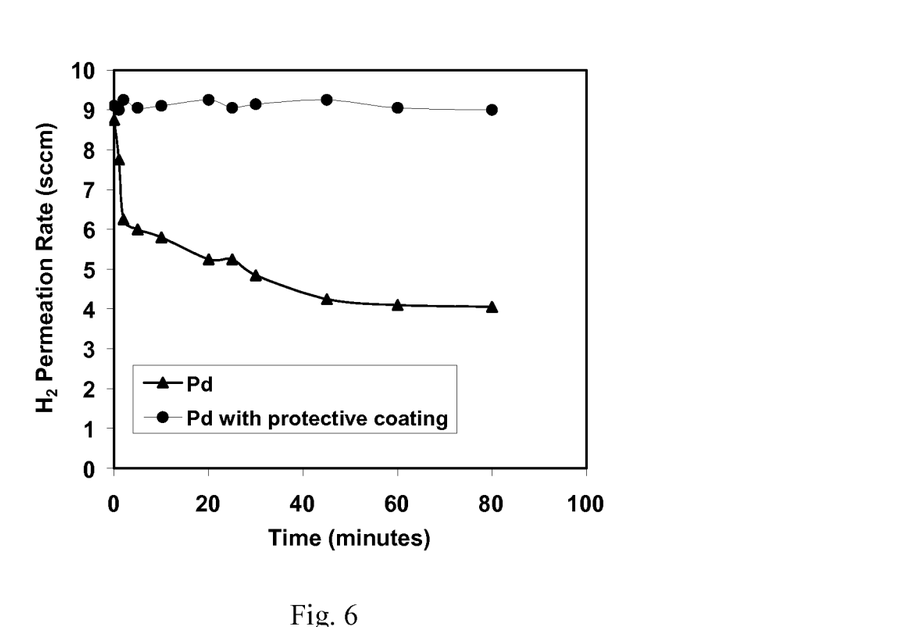
FIG. 6 is a graph plotting $H_2$ permeance over time in standard cubic feet per minute (sccm) of a 25 μm palladium layer with (circle) and without (triangle) a 2 nm protective coating (12) according to an embodiment of the invention, in the presence of 33 ppm $H_2S$ at 500° C. with a hydrogen partial pressure of 15 psi.
Figure 7:
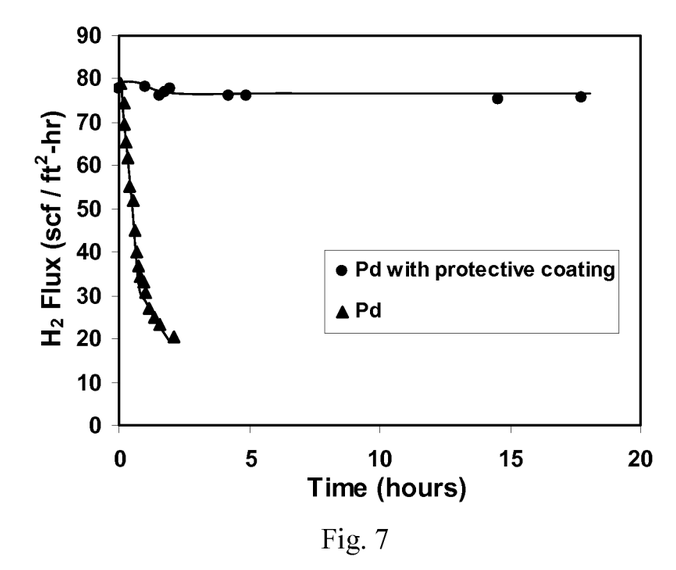
FIG. 7 is a graph plotting $H_2$ flux over time of a 25 μm palladium layer with (circle) and without (triangle) a 2 nm protective coating (12) according to an embodiment of the invention in the presence of 200 ppm $H_2S$ at 400° C. and a hydrogen partial pressure of 100 psi.

Silica is inert to most chemicals. It is able to withstand a large amount of sulfur, well above the 1-2% of sulfur content often found in process gases. The sulfur resistance of hydrogen selective coatings 12 according to an embodiment of the invention is demonstrated by testing hydrogen permeance of 25 μm thick palladium membranes with and without a 2 nm thick $SiO_2$ protective coating 12 deposited by plasma ALD in an hydrogen gas atmosphere having 33.3 ppm $H_2S$ at 500° C. and 15 psi hydrogen partial pressure. As is shown in FIG. 6, the palladium membrane with a protective coating 12 shows an unchanged hydrogen permeance throughout the course of testing while the hydrogen permeance for the palladium membrane without a protective coating drops drastically to half of its original permeance in only 80 minutes. This shows the immediate and detrimental effect of trace amounts of $H_2S$ on palladium. The thin $SiO_2$ protective coating 12 not only allows hydrogen to transport through it but also protects the underlying palladium membrane from the deleterious effects of $H_2S$. Further, the performance of coating 12 at higher $H_2S$ is shown in FIG. 7 where 25 μm thick palladium membranes with and without a 2 nm thick $SiO_2$ protective coating 12 were exposed to hydrogen gas containing trace gases including 200 ppm $H_2S$ at 400° C. and 100 psi $H_2$ differential pressure. As can be seen in FIG. 7, even at such high $H_2S$ levels, $H_2$ flux remains stable for the coated Pd membrane over a period of 18 hours, while $H_2$ flux for the uncoated Pd membrane drops rapidly. This demonstrates the sulfur resistance of coating 12 at higher $H_2S$ levels.

Figure 8:
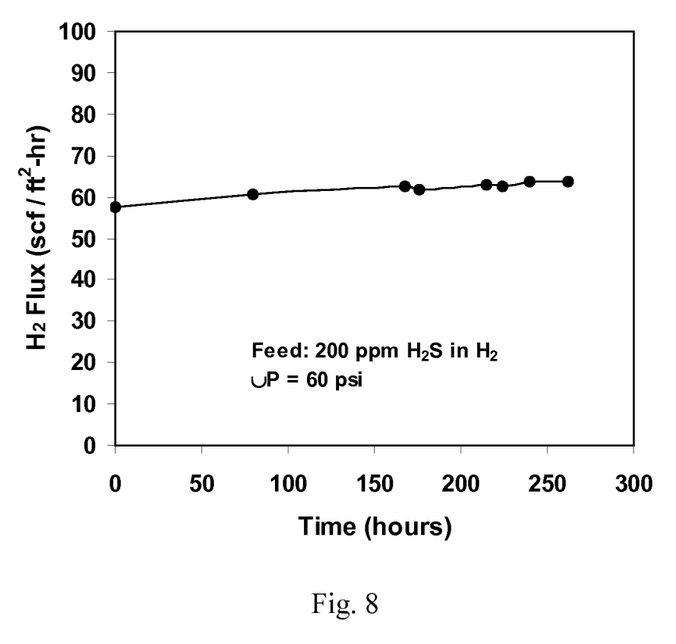
FIG. 8 is a graph plotting $H_2$ flux over time of a 25 μm palladium layer coated with a 2 nm protective coating (12) according to an embodiment of the invention in the presence of 200 ppm $H_2S$ in $H_2$ for 275 hours at a hydrogen partial pressure of 60 psi.

Referring to FIG. 8, long term testing was conducted in the presence of a hydrogen gas containing trace gases including 200 ppm $H_2S$ for 275 hours at 400° C. $H_2$ flux was performed on a 25 μm thick palladium membrane with a 5 nm thick $SiO_2$ protective coating 12 deposited by thermal ALD. The data shows that $H_2$ flux did not decrease during the entire testing period. This further demonstrates the stable performance that can be obtained even in the presence of high $H_2S$ levels over an extended period of time with the protective coating 12 according an embodiment of the invention.

Thermal stability testing was conducted on a 25 μm thick palladium membrane with a 2 nm thick $SiO_2$ protective coating 12. The coated article was subjected to 10 thermal cycles between 500° C. and room temperature. The coated article was heated from room temperature to 500° C. in air and maintained for a short time then allowed to cool in an uncontrolled manner to room temperature. This constitutes one thermal cycle. After 10 thermal cycles, transmission electron microscope (TEM) results of the coating showed that the silica coating was pin-hole free and crack free and that repeated temperature changes did not cause any cracks in the coating or interfacial separation or delamination between the Pd membrane and the ALD deposited silica coating. This shows the thermal stability of the coating.

Some embodiments of coated article 10 can be used in a variety of applications, including but not limited to the use as a hydrogen separation membrane in coal gasification, chemical processing and production, refinery processing, and fuel production, including biofuel production. For example, a protected membrane can be used to recover hydrogen from hydrodesulfurization process in oil refineries and to adjust the syngas ratio for downstream Fischer-Tropsch reaction. It can also be used as membrane reactor for dehydrogenation or hydrogenation chemical processes to boost the yield of desired products. Embodiments of the invention can be used for hydrogen separation and recovery from hydrogen containing gas streams including various combinations of gas constituents such as: $CO_2$, CO, $N_2$, $CH_4$, water vapor and trace amount of $O_2$, $H_2S$, ammonia, halide, HCN, other hydrocarbons, mercury, arsenic, selenium, carbonyl sulfide, argon, etc. Such gas streams include synthesis gas from coal gasification, petroleum fuel gasification, or biomass gasification. Other uses and applications will be readily apparent to those skilled in the art and will be understood to be within the scope of the invention.

Figure 9:
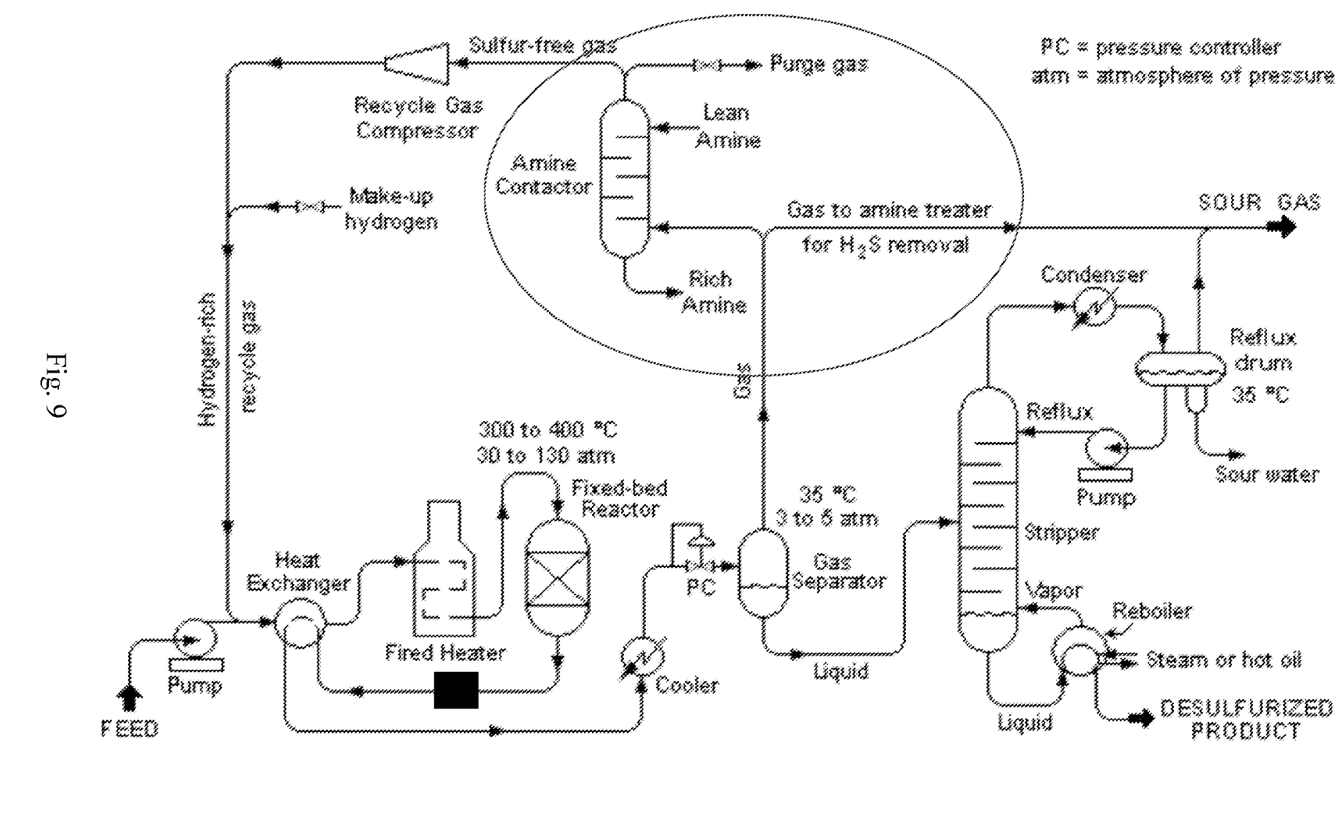

As mentioned, desulfurization or sulfur scrubbing/polish prior to hydrogen separation is typically required in industry and adds extra costs to hydrogen recovery. FIG. 9 is a process flow diagram for typical hydrodesulfurization processing at petroleum and natural gas refineries. The encircled portion of the diagram is essentially a desulfurization sub-system that includes an amine contactor for scrubbing sulfur from a process gas stream and further requires subsequent amine removal including boiling and condensations steps. The need for the desulfurization sub-system could be eliminated including the addition and subsequent removal of amine and other steps with the use of a hydrogen separation membrane or module incorporating one or more coated articles 10 according to some embodiments of the invention. Replacing the sub-system could result in significant cost savings and reduction in upfront capital expenditures and ongoing operational and maintenance costs. For example, coated article 10 could be inserted into the process right after a catalytic hydrodesulfurizer as the operating temperature and pressure of the membrane is consistent with the typical exit gas temperatures (300-400° C.) and pressures (30-130 atm) and no additional heat and gas compression would be required for this operation. In FIG. 9, the black box indicates where a coated article 10 or a module incorporating a plurality of coated articles 10 could be inserted in the process to replace the encircled portion.

While a preferred embodiment of the present invention has been described, it should be understood that various changes, adaptations and modifications may be made therein without departing from the spirit of the invention and the scope of the appended claims.

What is claimed:
1. A hydrogen selective coated article, comprising:
a hydrogen permeable substrate comprised of a nonporous metal layer comprising palladium or a palladium alloy; and
an atomic layer deposition deposited hydrogen selective coating on top of the hydrogen permeable substrate having a thickness from about 0.5 nm to about 100 nm, the atomic layer deposition deposited hydrogen selective coating comprising a metal oxide.

2. The coated article of claim 1 wherein the substrate is further comprised of a porous support.

3. The coated article of claim 1 wherein the hydrogen selective coating has a hydrogen permeation activation energy of at least 37.0 kJ/mol.

4. The coated article of claim 1 wherein the metal oxide comprises silica.

5. The coated article of claim 1 wherein the metal oxide comprises high density silica having a hydrogen permeation activation energy of at least 39.0 kJ/mol.

6. The coated article of claim 1 wherein the nonporous metal layer comprising palladium or the palladium alloy is a cermet membrane.

7. The coated article of claim 1 wherein the article has hydrogen permeability of at least 129 scf/ft$^2$-h-100 psia at temperatures of about 600° C.

8. The coated article of claim 1 wherein the nonporous metal layer consists of palladium metal and the hydrogen selective coating consists of silica.

9. The coated article of claim 1 wherein the hydrogen selective coating has a thickness ranging from about 0.5 nm to about 80 nm.

10. The coated article of claim 1 wherein the hydrogen selective coating has a thickness ranging from about 0.5 nm to about 20 nm.

11. A method of forming a hydrogen selective coated article, comprising the steps of:
　a) providing an atomic layer deposition system having a deposition chamber;
　b) providing a hydrogen permeable nonporous substrate in the chamber, the hydrogen permeable nonporous substrate comprising palladium or a palladium alloy; and
　c) depositing a hydrogen selective metal oxide layer on top of the hydrogen permeable nonporous substrate with the atomic layer deposition system.

12. The method of claim 11 wherein the metal oxide layer comprises silica.

13. The method of claim 11 wherein depositing the hydrogen selective metal oxide layer comprises depositing the hydrogen selective metal oxide layer with a thickness ranging from about 0.5 nm to about 50 nm.

14. The method of claim 11 wherein the metal oxide layer has a hydrogen selective metal oxide layer has a hydrogen permeation activation energy of at least 37.0 kJ/mol.

15. A method of separating hydrogen gas from a gas stream, comprising the steps of:
　providing a hydrogen purification membrane comprised of a hydrogen permeable nonporous metal layer comprising palladium or a palladium alloy coated with an ALD deposited silica layer;
　contacting a first side of the membrane containing the ALD deposited silica layer with a hydrogen containing gas stream; and
　separating hydrogen gas from the gas stream.

16. The method of claim 15 further comprising the step of: collecting hydrogen gas that has been separated from the gas stream.

* * * * *